United States Patent [19]
Frisch et al.

[11] Patent Number: 5,442,281
[45] Date of Patent: Aug. 15, 1995

[54] METHOD AND APPARATUS FOR DERIVING POWER CONSUMPTION INFORMATION FROM THE ANGULAR MOTION OF A ROTATING DISK IN A WATT HOUR METER

[75] Inventors: Myron I. Frisch, Minneapolis; Ahmed Naumaan, Bloomington, both of Minn.

[73] Assignee: EnScan, Inc., Spokane, Wash.

[21] Appl. No.: 69,704

[22] Filed: Jun. 1, 1993

[51] Int. Cl.⁶ .................... G01R 11/02; G01R 22/00; G01D 5/34; G01P 13/04
[52] U.S. Cl. .................. 324/137; 250/231.13; 324/96; 324/142; 324/157; 324/165; 324/175; 364/483
[58] Field of Search .................. 324/96, 137, 142, 157, 324/165, 175; 341/13, 14; 250/231.13, 231.14, 231.17, 231.18; 340/870.02, 870.03, 870.28, 870.29; 364/483; 356/28, 373, 375

[56] References Cited

U.S. PATENT DOCUMENTS

| | | | |
|---|---|---|---|
| 1,878,658 | 4/1929 | Aronoff . | |
| 3,127,594 | 3/1964 | Roe et al. | 340/203 |
| 3,740,633 | 6/1973 | Buttafava | 318/328 |
| 4,034,292 | 7/1977 | McClelland, III | 324/157 |
| 4,162,399 | 7/1979 | Hudson | 251/231 SE |
| 4,281,325 | 7/1981 | Jarva | 340/870.29 |
| 4,298,839 | 11/1981 | Johnston | 324/157 |
| 4,321,531 | 3/1982 | Marshall | 324/142 |
| 4,327,362 | 4/1982 | Hoss | 340/870.02 |
| 4,328,463 | 5/1982 | Avins | 341/13 X |
| 4,350,980 | 9/1982 | Ward | 340/870.02 |
| 4,500,870 | 2/1985 | Krohn et al. | 340/347 P |
| 4,587,513 | 5/1986 | Burrowes et al. | 340/347 P |
| 4,588,982 | 5/1986 | Goodwin | 340/347 P |
| 4,604,725 | 8/1986 | Davies et al. | 364/900 |
| 4,650,995 | 3/1987 | Tokunaga et al. | 324/175 X |
| 4,660,036 | 4/1987 | Mosier | 340/870.29 |
| 4,670,737 | 6/1987 | Rilling | 340/347 P |
| 4,678,907 | 7/1987 | Lipski et al. | 250/231 SE |
| 4,712,372 | 12/1987 | Dickey et al. | 60/39.281 |
| 4,713,610 | 12/1987 | Willis | 324/157 |
| 4,792,677 | 12/1988 | Edwards et al. | 250/231 SE |
| 4,827,123 | 5/1989 | Gray | 250/231 SE |
| 4,956,551 | 9/1990 | Repschlager et al. | 250/231.14 |
| 5,021,735 | 6/1991 | Maass et al. | 324/175 |
| 5,130,641 | 7/1992 | Cornwall et al. | 324/175 X |

FOREIGN PATENT DOCUMENTS

4013936  10/1991  Germany .............................. 341/13

*Primary Examiner*—Gerard R. Strecker
*Attorney, Agent, or Firm*—Townsend and Townsend Khourie and Crew

[57] ABSTRACT

An apparatus for recording information about the angular motion of a rotatable disk disposed in a first structure is provided. The disk has regions with differing properties with respect to electromagnetic energy. The apparatus includes first means for emitting a first sequence of electromagnetic energy pulses in a first direction toward the disk. The first emitting means are mounted on the first structure adjacent a first side of the disk. The apparatus also includes second means for emitting a second sequence of electromagnetic energy pulses in a second direction toward the disk, the second emitting means also being mounted on the first structure adjacent the first side of the disk. The first and second directions are such that the first and second sequences of electromagnetic energy pulses reflect from the first side of the disk in different areas, the areas being separated in the direction of rotation of the disk. Photosensitive means are mounted on the first structure so that they can receive the electromagnetic energy pulses from both the first and second emitting means at a single point. The photosensitive means generate a signal in response to the received electromagnetic energy pulses. A controller coupled to the photosensitive means then processes the signal to determine the number of rotations of the disk, and the direction of rotation of the disk.

37 Claims, 4 Drawing Sheets

SECTION A-A
FIG. 2e.

METHOD AND APPARATUS FOR DERIVING POWER CONSUMPTION INFORMATION FROM THE ANGULAR MOTION OF A ROTATING DISK IN A WATT HOUR METER

BACKGROUND OF THE INVENTION

This invention relates to a device and method for monitoring the angular motion of a rotatable disk, aid specifically a device and apparatus for monitoring and deriving power consumption information from the rotatable disk in a standard watt-hour meter.

As is well known in the art, one type of widely used watt-hour meter employs a horizontally disposed rotatable disk which rotates in response to the consumption of electrical energy. Also included in such watt-hour meters are a plurality of dials which electro-mechanically record the number of rotations of the rotatable disk, thereby keeping track of power consumption. In the past, various alternatives to electromechanically recording power consumption have been employed to increase the accuracy of the measurement as well as to provide remote sensing capabilities. For example, systems have been designed which use electromagnetic energy (EM) to monitor rotations of the disk by means of the detection of a non-reflective mark on the surface of the disk, or the transmission of the energy through an aperture in the disk. The EM source is usually mounted on the watt-hour meter structure so that its emitted energy impinges upon the surface of the disk. A sensor is positioned so that when the mark, or aperture, passes the EM source, the sensor detects the resulting drop-off in reflected energy, or the transmission of energy through the disk. Some sort of processing circuitry then derives and accumulates energy consumption data from the resulting signal. This data may then be communicated to remote locations by various techniques, including encoded transmission over power lines, or infrared transmission. Examples of such systems are described in U.S. Pat. No. 4,399,510 to Hicks, U.S. Pat. No. 4,301,508 to Anderson, et al., and U.S. Pat. No. 4,350,980 to Ward.

Some systems have been developed which have the ability to determine not only the number of rotations, but also the direction of rotation of the disk. This capability is desirable for the detection of unauthorized access to and tampering with power monitoring equipment. Two such systems are described in U.S. Pat. No. 4,678,907 to Lipski et al., and U.S. Pat. No. 4,321,531 to Marshall. Each of these systems employs two photosensitive sensors and associated circuitry to determine the direction of rotation. While such systems have proven to be effective in some applications, the present invention has the advantage of achieving the same capability using only one sensor.

SUMMARY OF THE INVENTION

An apparatus for recording information about the angular motion of a rotatable disk disposed in a first structure is provided. The disk has regions with differing properties with respect to electromagnetic energy. The apparatus includes first means for emitting a first sequence of electromagnetic energy pulses in a first direction toward the disk. The first emitting means are mounted on the first structure adjacent a first side of the disk. The apparatus also includes second means for emitting a second sequence of electromagnetic energy pulses in a second direction toward the disk, the second emitting means also being mounted on the first structure adjacent the first side of the disk. The first and second directions are such that the first and second sequences of electromagnetic energy pulses reflect from the first side of the disk in different areas, the areas being separated in the direction of rotation of the disk. Photosensitive means are mounted on the first structure so that they can receive the electromagnetic energy pulses from both the first and second emitting means at a single point. The photosensitive means generate a signal in response to the received electromagnetic energy pulses. A controller coupled to the photosensitive means then processes the signal to determine the number of rotations of the disk, and the direction of rotation of the disk.

In one embodiment of the invention, the first and second emitting means comprise infrared emitting diodes (IREDs), and the photosensitive means comprise a photo diode. Regions on the first side of the disk have differing reflective properties with respect to infrared energy. The controller is coupled to the IREDs causing them to emit infrared pulses in a particular sequence. The pulses reflect from the first side of the disk and are received by the photo diode which generates a signal, the characteristics of which depend upon the regions from which the infrared pulses are reflected. In a particular embodiment, the first structure comprises a standard watt-hour meter.

It should be understood that the invention can be configured not only in a reflective mode as described above, but also in a transmissive mode. In such an embodiment, the first and second emitting means would be disposed on the opposite side of the rotatable disk from the photosensitive means, the first and second emitting means being spatially separated in the direction of rotation of the disk. Instead of a nonreflective, radiation-absorbing region, the disk would have at least one aperture through which the photosensitive memos could sense pulses of electromagnetic energy from the first and second emitting means.

A method for deriving information about the rotation of a rotatable disk using an embodiment of the above-described apparatus is also provided. Electromagnetic energy from the first emitting means is reflected from the first side of the disk and received by the photosensitive means at a first point. A first signal pulse corresponding to the received electromagnetic energy is then generated. Electromagnetic energy from the second emitting means is theft reflected off of the disk and received by the photosensitive means at the same point. A second signal pulse corresponding to the received electromagnetic energy is then generated. These steps are repeated, generating a pulse train comprising the first and second signal pulses. The pulse train is then processed to determine the number of rotations of the disk, and the direction of rotation of the disk. For a particular application, the pulse train repetition period and pulse durations are constrained in accordance with the sampling theorem Nyquist rate, depending on the maximum rate of rotation of the disk and its reflective (or transmissive) features.

A further understanding of the nature and advantages of the present invention may be realized by reference to the remaining portions of the specification and the drawings.

BRIEF DESCRIPTION OF THE DRAWINGS

FIG. 5 is a state diagram illustrating the operation of a particular embodiment of the present invention.

DESCRIPTION OF THE SPECIFIC EMBODIMENTS

Figure 1:
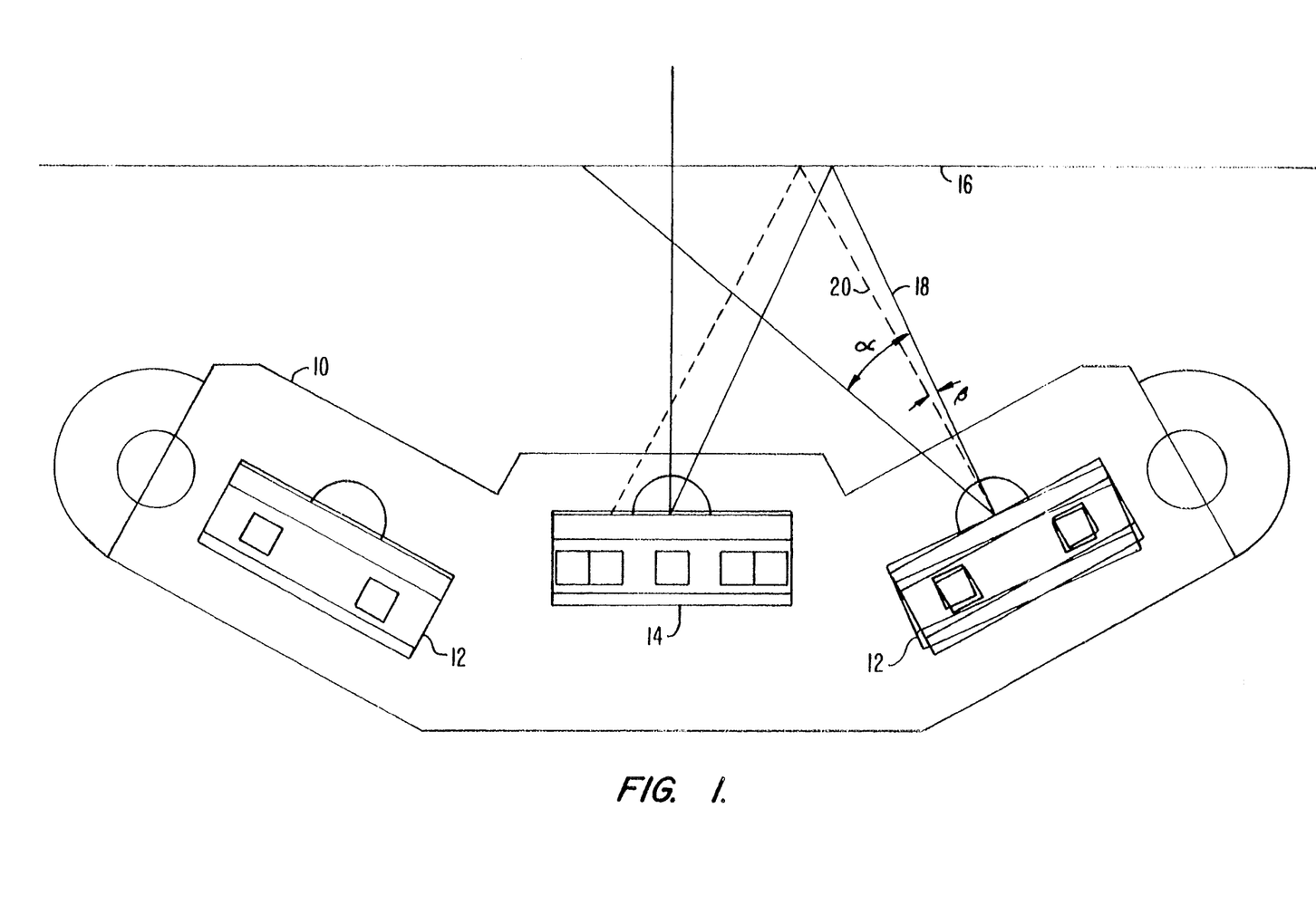
FIG. 1 depicts an assembly designed according to the present invention adapted for mounting in a standard watt-hour meter.
Figure 2A:
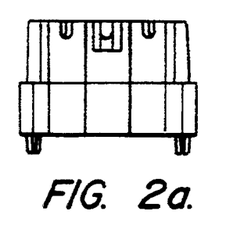
FIGS. 2a-2g show various views of the assembly of FIG. 1.
Figure 2B:
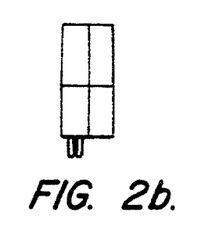
Figure 2C:
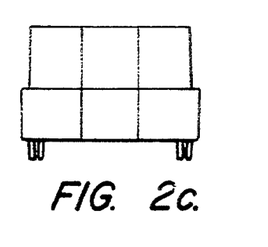
Figure 2D:
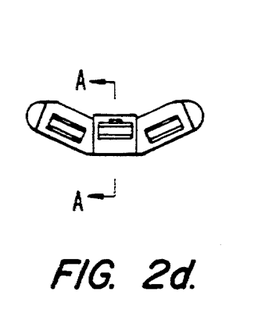
Figure 2E:
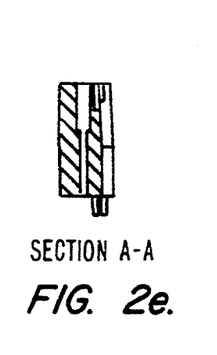
Figure 2F:
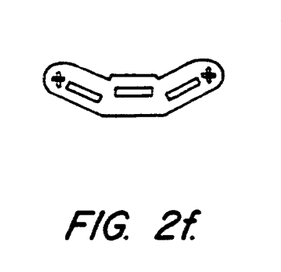
Figure 2G:
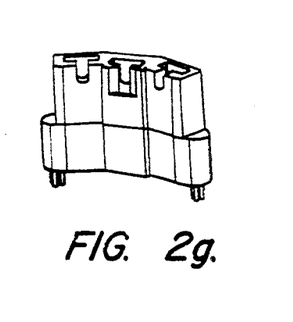

FIG. 1 depicts an assembly designed according to a particular embodiment of the present invention. A housing 10 is adapted for mounting in a standard watt-hour meter. Two infrared emitting diodes (IREDs) 12 are mounted in housing 10 on either side of a photo diode 14. IREDs 12 are mounted so that the infrared energy emitted from each IRED reflects off of the surface of a rotatable disk 16 and is received by photo diode 14. The infrared energy from each IRED 12 reflects off of slightly separated areas on the bottom surface of disk 16. The areas are separated in the direction of rotation of the disk.

The spread of the infrared "beam" from each IRED is roughly 25° from the center of the beam as shown by angle $\alpha$ in the figure. FIG. 1 also illustrates the effect that a slight misalignment of the right IRED has on the angle of incidence of the reflected infrared energy. Solid line 18 represents the center axis of the infrared energy beam for the preferred mounting angle, and dashed line 20 represents the center axis of the beam for a 4° rotation in the mounting angle (angle $\beta$). The preferred mounting angle sets up an angle of approximately 28.8° between the center axis of the infrared energy beam and the vertical. As is shown in the figure, the center axis of the reflected energy deviates only slightly from the center of photo diode 14, even with a substantial misalignment. Thus, this configuration ensures that even if either, or both, of the IREDs are misaligned, infrared energy of sufficient intensity will reach the photo diode to enable proper operation. FIGS. 2a-2g show various views of housing 10 of FIG. 1.

Figure 3:
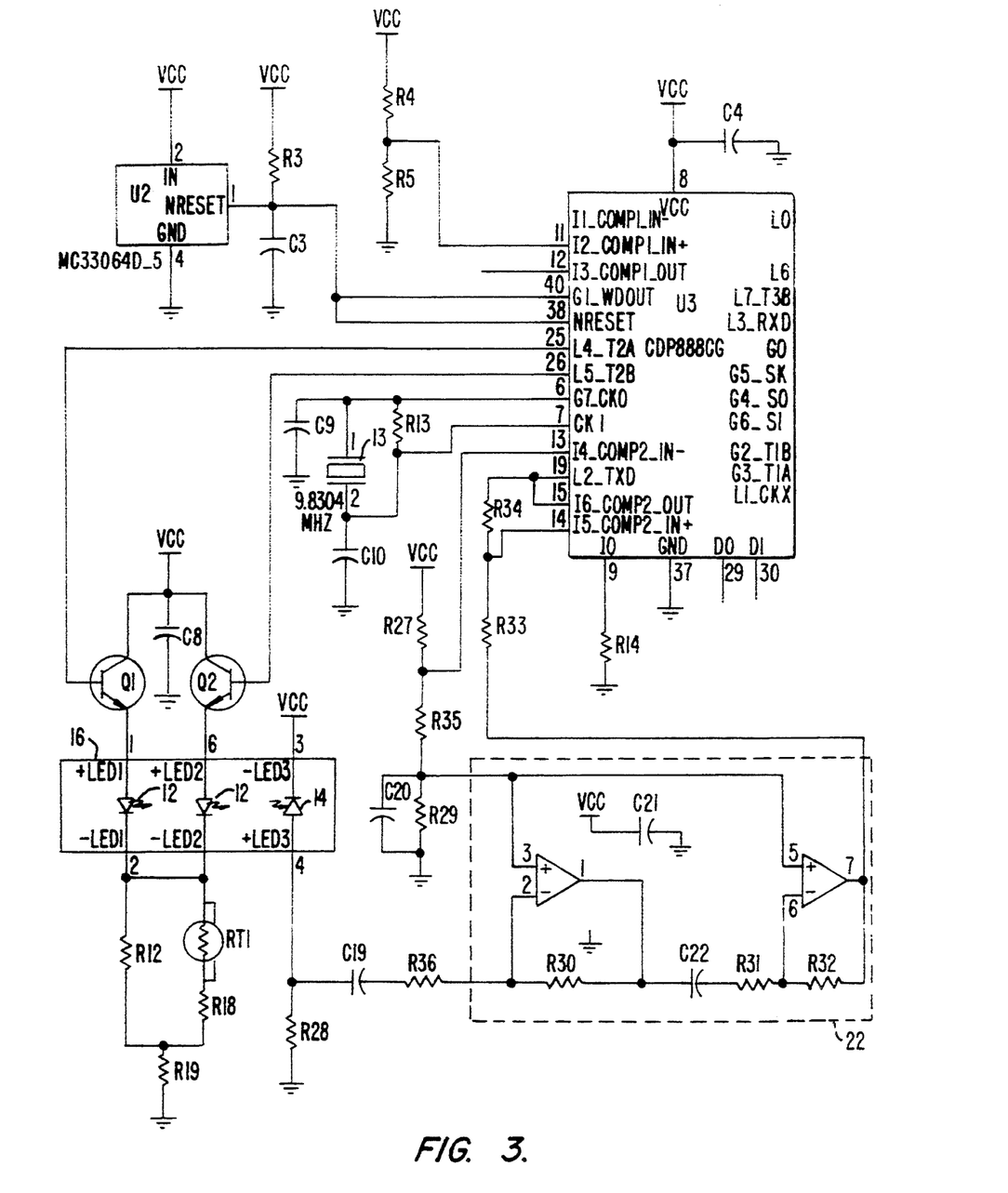
FIG. 3 is a schematic diagram of a particular embodiment of the present invention.

FIG. 3 is a schematic diagram of a particular embodiment of the present invention. The anodes of IREDs 12 are pulsed by NPN driver transistors Q1 and Q2 under the firmware timing control of a microcontroller U3. The network comprising resistors R12, R18, R19, and thermistor RT1 determines the drive current level for IREDs 12, with RT1 providing compensation for the variation of IRED output irradiance with temperature. The photo diode 14 receives input in the form of infrared energy reflected from a rotatable disk (not shown). Output current pulses from photo diode 14 are then conditioned by a two stage ac-coupled operational amplifier circuit 22 with a decision threshold set by a voltage divider comprising R27, R35, and R29. The resulting output is received by a comparator embedded in microcontroller U3. The comparator output is a logic high for high amplitude pulses which exceed the decision threshold, and a logic low for low amplitude pulses which do not exceed the decision threshold. Firmware in microcontroller U3 implements a periodic sequence of drive pulses and state machine logic for processing, tracking, and decoding the power consumption information contained in the reflected infrared energy. The firmware determines disk rotational direction and accumulates the result as encoded registration of accumulated energy consumption, matching the external watt-hour meter's electro-mechanical register.

The operation of the above-described embodiment is as follows. IREDs 12 are periodically pulsed in sequence. Sequence timing is determined by the microcontroller's crystal oscillator 13 which is stable with respect to initial tolerance, temperature, and aging to within ±500 parts per million. The resulting range of periods is 976.1 $\mu$s to 977.1 $\mu$s, with a preferred period of 976.6 $\mu$s. During each period, the left IRED is turned on first for a first interval. Both IREDs are then held off for a second interval. Then the right IRED is turned on for a third interval. The duration of the first interval is 17.28 $\mu$s to 17.30 $\mu$s, with a preferred duration of 17.29 $\mu$s. The duration of the second interval is 0 to 1.018 $\mu$s, with a preferred duration of 1.017 $\mu$s. The duration of the third interval is 19.32 $\mu$s to 19.34 $\mu$s, with a preferred duration of 19.33 $\mu$s. Finally, both IREDs are held off for the remainder of the period, the duration of this interval being 939.0 $\mu$s when the other intervals are the preferred durations. The output of photo diode 14 follows this pulse sequence yielding high amplitude output current pulses when receiving reflected energy from the shiny metal disk surface; and receiving much lower amplitude pulses when receiving reflected energy from a specially installed stripe of infrared absorbing paint along a particular radius on the disk's bottom surface. As the disk rotates during normal power consumption (i.e., in a counterclockwise direction), the stripe's leading edge passes through the left IRED's reflecting area, and then through the right IRED's reflecting area. As disk rotation continues, the stripe's trailing edge clears the left IRED, and then the right IRED, so that their radiated energy once again reflects off of the shinier metal disk surface to the photo diode. Due to the input sequence of pulses, the pulse train which appears at the output of the photo diode has well defined characteristics which are recognized and processed by the controller. Under exceptional conditions (e.g., tampering), the meter disk rotates in the reverse or clockwise direction. In such cases, the radiation-absorbing stripe passes over the right IRED first. The characteristics of the resulting pulse train are distinctly different from those of the pulse train produced under normal conditions. Upon the occurrence of such an event, the controller is able to determine the direction of rotation of the disk due to the predictable variations in the photo diode signal.

Figure 4:
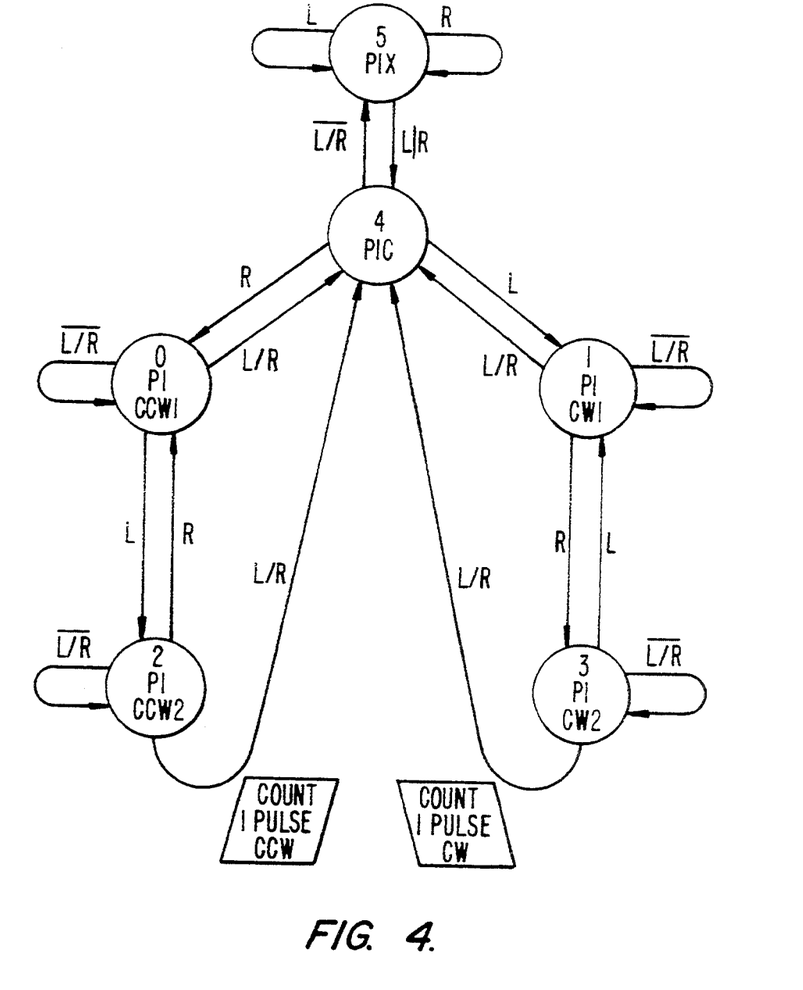
FIG. 4 shows a specific embodiment of the invention in a transmissive mode configuration.

It should be understood that the invention can be configured not only in a reflective mode as described above, but also in a transmissive mode. FIG. 4 shows a specific embodiment of the invention in a transmissive mode configuration. In such an embodiment, assembly 10' with the two IREDs 12 would be disposed on the opposite side of the rotatable disk 16' from the photo-sensitive device 14, the IREDs 12 being spatially separated in the direction of rotation of the disk 16'. Instead of a radiation-absorbing stripe, the disk 16' would have at least one aperture 17 through which the photo diode 14 could sense the infrared pulses from the IREDs 12. In a transmissive embodiment, the firmware would be suitably altered to recognize and process infrared pulses in a complementary manner with respect to the reflective embodiment described above. The present invention may also be adapted to recognize fractional rotations of the disk using multiple radiation-absorbing stripes or transmissive apertures.

It should also be understood that the interval durations discussed above represent only one embodiment of the invention. Interval durations can vary widely for different applications. For example, not only can the interval between the pulsing of the two IREDs be of zero duration, but these pulses can theoretically overlap. As long as the sampling rate is chosen so that the microcontroller can determine from which IRED a particular pulse is coming, it is not necessary to insert a positive interval between the two pulses. The maximum sampling rate is limited by such factors as the rise and fall times of the optoelectronic devices, amplifier settling times, and the amount of microcontroller time available.

The durations of the IRED pulses can also deviate substantially from the specific values of the above-described embodiment. Factors to be considered when determining interval durations for a specific application are the size of the features of the rotatable disk, the reflective (or transmissive) properties of the disk, and the maximum rotational rate of the disk. As mentioned above, the pulse train repetition period and pulse durations are constrained in accordance with the sampling theorem Nyquist rate, depending on these factors.

Correct operation of the photo diode over the range of meter types, electronic component parameter variation, and operating conditions (e.g., temperature, mounting alignment, and the 20 to 30 year operational life), depends on the proper choice of the decision threshold level. The threshold level is chosen so that it lies between pulse amplitudes estimated for the worst case (i.e., least reflective) shiny metal disk surface and the worst case (i.e., most reflective) infrared-absorbing stripe.

FIG. 5 is a state diagram illustrating the operation of the embodiment of FIG. 3 according to the firmware. When power is supplied to the invention, the circuitry comes up initially in state 5. State transitions occur according to the events L and R. The event L represents that the left IRED has been energized and a photo diode output pulse which exceeds the decision threshold was registered. The event R represents an equivalent event for the right IRED. L/R represents the occurrence of both events L and R, while a bar over this symbol represents the non-occurrence of the event. State changes do not occur where there is no change in the output pulse train.

The firmware code represented by the state diagram of FIG. 4 is included in Appendix A.

While the invention has been particularly shown and described with reference to a specific embodiment thereof, it will be understood by those skilled in the art that the foregoing and other changes in the form and details may be made therein without departing from the spirit or scope of the invention.

Appendix A
Firmware Listing

| | | | | |
|---|---|---|---|---|
| 323 | | .FORM | | |
| 323 | | ;************************************************************ | | |
| 323 | ; | PI State Machine | | |
| 323 | ; | | | |
| 323 | ; | Sample current PI input, flag PI sensor tamper | | |
| 323 | ; | If input has changed, execute the state machine. | | |
| 323 | | ;************************************************************ | | |
| 323 0203 9FD2 | | LD | B,#PORTLP | ;Reg b => PI Sensor |
| 323 0205 72 | | IFBIT | PISENSE,[B] | ;PI Sensor already on? |
| 323 0206 BD0B6C | | RBIT | PITMP.ESTAT | ;Yes - Flag it for tamper report |
| 323 0209 9FD0 | | LD | B,#PORTLD | ;Reg b => PI IREDs on this port |
| 323 020B 7D | | SBIT | IREDL,[B] | ;Turn on left IRED and wait |
| 323 020C 64 | | CLR | A | ;Reg a will accumulate result |
| 323 020D A0 | | RC | | ;Carry will temp store result |
| 323 020E 9FD2 | | LD | B,#PORTLP | ;Reg b => PI Sensor |
| 323 0210 B8 | | NOP | | ;Wait 10μsec for valid output |
| 323 0211 B8 | | NOP | | |
| 323 0212 B8 | | NOP | | |
| 323 0213 B8 | | NOP | | |
| 323 0214 72 | | IFBIT | PISENS,[B] | ; Read result |
| 323 0215 8A | | INC | A | ; and save it |
| 323 0216 72 | | IFBIT | PISENS,[B] | ;Read result |
| 323 0217 8A | | INC | A | ; and save it |
| 323 0218 72 | | IFBIT | PISENS,[B] | ;Read result |
| 323 0219 8A | | INC | A | ; and save it |
| 323 021A 9FD0 | | LD | B,#PORTLD | |
| 323 021C 6D | | RBIT | IREDL,[B] | ;Turn off left IRED |
| 323 021D 7C | | SBIT | IREDR,[B] | ;Turn on right IRED and wait |
| 323 021E 9301 | | IFGT | A,#1 | ;0-1 => 2-3 => on |
| 323 0220 A1 | | SC | | ;Carry has left IRED result |
| 323 0221 64 | | CLR | A | ;Reg a will have right IRED result |
| 323 0222 9FD2 | | LD | B,#PORTLP | |
| 323 0224 B8 | | NOP | | ;Wait 10μsec for valid output |
| 323 0225 B8 | | NOP | | |
| 323 0226 B8 | | NOP | | |
| 323 0227 B8 | | NOP | | |
| 323 0228 72 | | IFBIT | PISENS,[B] | ;Read result |
| 323 0229 8A | | INC | A | ; and save it |
| 323 022A 72 | | IFBIT | PISENS,[B] | ;Read result |
| 323 022B 8A | | INC | A | ; and save it |
| 323 022C 72 | | IFBIT | PISENS,[B] | ;Read result |
| 323 022D 8A | | INC | A | ; and save it |
| 323 022E 9FD0 | | LD | B,#PORTLD | |
| 323 0230 6C | | RBIT | IREDR.[B] | ;Turn off right IRED |

-continued
Appendix A
Firmware Listing

| | | | | |
|---|---|---|---|---|
| 323 | | .FORM | | |
| 323 0231 9301 | | IFGT | A.#1 | ;0-1 => off. 2-3 => on |
| 323 0233 02 | | JP | L10 | |
| 323 0234 64 | | CLR | A | |
| 323 0235 02 | | JP | L20 | |
| 323 | L10: | | | |
| 323 0236 9801 | | LD | A.#1 | |
| 323 | L20: | | | ;Reg a has new sample |
| 323 0238 A8 | | RLC | A | ;Reg a has new sample |
| 323 0239 9600 | | XOR | A.#TYPEI*(PIL!PIR) | ;Set correct logic sense |
| 323 023B 9F3C | | LD | B.#INPI | ;Reg b => Saved PI Input |
| 323 023D 82 | | IFEQ | A.[B] | ;Is new reading a change? |
| 323 023E 22A1 | | JMP | PIDONE | ; No - Skip further service |
| 323 0240 A6 | | X | A.[B] | ; Yes - Store new value |
| 323 0241 9847 | | LD | A.#L(TBPI) | ;Base of table of PI States |
| 323 0243 BD3D84 | | ADD | A.PISTAT | ;Compute table index |
| 323 0246 A5 | | JID | | ;Branch to correct state |
| 323 | TBPI: | | | |
| 323 0247 86 | | .BYTE | L(CCW1) | ;State 0: PI CCW1 |
| 323 0248 69 | | .BYTE | L(CW1) | ;State 1: PI CWI |
| 323 0249 8E | | .BYTE | L(CCW2) | ;State 2: PI CCW2 |
| 323 024A 71 | | .BYTE | L(CW2) | ;State 3: PI CW2 |
| 323 024B 55 | | .BYTE | L(PIC) | ;State 4: PI Center |
| 323 024C 4D | | .BYTE | L(PIX) | ;State 5: PI Initial |
| 323 | PIX: | | | ;State 5: Initial PI machine state |
| 323 024D | | TSTST | 4,(PIL!PIR) | |
| 323 024D 9803 | | LD | A,#(PIL!PIR) | |
| 323 024F 82 | | IFEQ | A,[B] | |
| 323 0250 BC3D04 | | LD | PISTAT.#4 | |
| 323 0253 22A1 | | JMP | PIDONE | |
| 323 | PIC: | | | ;State 4: Center PI Machine State |
| 323 0255 | | TSTST | 0.PIR | |
| 323 0255 9802 | | LD | A.#PIR | |
| 323 0257 82 | | IFEQ | A,[B] | |
| 323 0258 BC3D00 | | LD | PISTAT.#0 | |
| 323 025B | | TSTST | 1.PIL | |
| 323 025B 9801 | | LD | A.#PIL | |
| 323 025D 82 | | IFEQ | A,[B] | |
| 323 025E BC3D01 | | LD | PISTAT.#1 | |
| 323 0261 | | TSTST | 5.0 | |
| 323 0261 9800 | | LD | A.#0 | |
| 323 0263 82 | | IFEQ | A,[B] | |
| 323 0264 BC3D05 | | LD | PISTAT.#5 | |
| 323 0267 22A1 | | JMP | PIDONE | |
| 323 | | .FORM | | |
| 323 | CW1: | | | ;State 1: Clockwise 1 PI State |
| 323 0269 | | TSTST | 3.PIR | |
| 323 0269 9802 | | LD | A.#PIR | |
| 323 026B 82 | | IFEQ | A.[B] | |
| 323 026C BC3D03 | | LD | PISTAT.#3 | |
| 323 026F 224D | | JMP | PIX | |
| 323 | CW2: | | | ;State 3: Clockwise 2 PI State |
| 323 0271 | | TSTST | 1.PIL | |
| 323 0271 9801 | | LD | A.#PIL | |
| 323 0273 82 | | IFEQ | A.[B] | |
| 323 0274 BC3D01 | | LD | PISTAT.#1 | |
| 323 0277 9803 | | LD | A,#(PIL!PIR) | |
| 323 0279 B9 | | IFNE | A,[B] | |
| 323 027A 22A1 | | JMP | PIDONE | |
| 323 | PLSCW | | | ;Count (pulse) a clockwise hole |
| 323 027C 9F3E | | LD | B,#HOLCW | |
| 323 027E AE | | LD | A,[B] | |
| 323 027F 8A | | INC | A | |
| 323 0280 A6 | | X | A,[B] | |
| 323 0281 BC3D04 | | LD | PISTAT.#4 | |
| 323 0284 22A1 | R | JMP | PIDONE | |
| 323 | CCW1: | | | ;State 0: Counter-clockwise 1 PI State |
| 323 0286 | | TSTST | 2,PIL | |
| 323 0286 9801 | | LD | A,#PIL | |
| 323 0288 82 | | IFEQ | A,[B] | |
| 3232 0289 BC3D02 | | LD | PISTAT.#2 | |
| 323 028C 224D | | JMP | PIX | |
| 323 | CCW2: | | | ;State 2: Counter-clockwise 2 PI State |
| 323 028E | | TSTST | 0,PIR | |
| 323 028E 9802 | | LD | A,#PIR | |
| 323 0290 82 | | IFEQ | A,[B] | |
| 323 0291 BC3D00 | | LD | PISTAT,#0 | |
| 323 0294 9803 | | LD | A.#(PIL!PIR) | |
| 323 0296 B9 | | IFNE | A,[B] | |
| 323 0297 22A1 | R | JMP | PIDONE | |

-continued

Appendix A
Firmware Listing

| 323 | PLSCCW: | | | ;Count (pulse) a counter-clockwise hole |
|---|---|---|---|---|
| 323 0299 9F3F | | LD | B,#HOLCCW | |
| 323 029B AE | | LD | A,[B] | |
| 323 029C 8A | | INC | A | |
| 323 029D A6 | | X | A,[B] | |
| 323 029E BC3D04 | | LD | PISTAT.#4 | |
| 323 | ; | jmp | PIDone | |
| 323 | PIDONE: | | | |

What is claimed is:

1. An apparatus for recording information about the angular motion of a rotatable disk disposed in a first structure, the disk having regions with differing properties with respect to electromagnetic energy, the apparatus comprising:

first means for emitting a first sequence of electromagnetic energy pulses in a first direction toward the disk, the first emitting means being mounted on the first structure adjacent a first side of the disk;

second means for emitting a second sequence of electromagnetic energy pulses in a second direction toward the disk, the second emitting means being mounted on the first structure adjacent the first side of the disk and separated from the first emitting means in the direction of rotation of the disk, the first and second directions being such that the first and second Sequences of electromagnetic energy pulses reflect from the first side of the disk in different areas, the areas being separated in the direction of rotation of the disk;

photosensitive means mounted on the first structure so that the photosensitive means can receive the electromagnetic energy pulses from both the first and second emitting means at a single point, the photosensitive means being for generating a signal in response to the received electromagnetic energy pulses; and a controller coupled to the photosensitive means for processing the signal to determine the number of rotations of the disk, and the direction of rotation of the disk, the controller also being for synchronizing the first and second sequences of electromagnetic energy pulses such that each electromagnetic energy pulse from the first emitting means is followed by an electromagnetic energy pulse from the second emitting means.

2. The apparatus of claim 1 wherein the photosensitive means comprises a photo diode.

3. The apparatus of claim 1 wherein the first and second emitting means comprise infrared emitting diodes and the electromagnetic energy pulses comprise infrared energy pulses.

4. The apparatus of claim 1 wherein the controller is coupled to the first and second emitting means so as to control the first and second sequences of electromagnetic energy pulses, thereby generating a third sequence of electromagnetic pulses.

5. The apparatus of claim 4 wherein the third sequence comprises:

(1) a first pulse for a first interval from the first emitting means;

(2) a second pulse for a third interval from the second emitting means;

(3) a fourth interval during which the first and second emitting means are off; and (4) repeated cycles comprising (1) through (3).

6. The apparatus of claim 5 wherein the first and third intervals overlap.

7. The apparatus of claim 1 wherein the regions on the first side of the disk have differing reflective properties with respect to electromagnetic energy, and the signal generated by the photosensitive means has characteristics dependent upon the reflective properties of the regions from which the electromagnetic energy pulses are reflected.

8. The apparatus of claim 7 wherein the first and second emitting means, and the photosensitive means are mounted on a housing, the photosensitive means being mounted on the housing between the first and second emitting means, the housing being mounted on the first structure.

9. The apparatus of claim 8 wherein the first structure is a standard watt-hour meter.

10. The apparatus of claim 9 wherein the rotatable disk is disposed in a substantially horizontal plane, and the housing is mounted in the standard watt-hour meter below the rotatable disk.

11. The apparatus of claim 1 wherein the disk has at least one aperture through which the electromagnetic energy pulses from the first and second emitting means are transmitted.

12. The apparatus of claim 11 wherein the photosensitive means is mounted on the first structure on the opposite side of the disk from the first and second emitting means.

13. An apparatus for recording information about the angular motion of a rotatable disk disposed in a first structure, a first side of the disk having regions with differing reflective properties with respect to electromagnetic energy, the apparatus comprising:

a housing mounted on the first structure adjacent the first side of the disk;

first means mounted on the housing for emitting a first sequence of electromagnetic energy pulses in a first direction toward the disk;

second means mounted on the housing for emitting a second sequence of electromagnetic energy pulses in a second direction toward the disk, the first and second directions being such that the first and second sequences of electromagnetic energy pulses reflect from the first side of the disk in different areas, the areas being separated in the direction of rotation of the disk;

photosensitive means mounted on the housing so that the photosensitive means can receive the reflected electromagnetic energy pulses from both the first and second emitting means at a single point, the photosensitive means being for generating a signal in response to the received electromagnetic energy pulses, the signal having characteristics dependent upon the reflective properties of the regions from which the electromagnetic energy pulses are reflected; and a controller coupled to the photosensitive means for processing the signal to determine the number of rotations of the disk, and the direction of rotation of the disk, the controller also being for synchronizing the first and second sequences of electromagnetic energy pulses such that each electromagnetic energy pulse from the first emitting means is followed by an electromagnetic energy pulse from the second emitting means.

14. The apparatus of claim 13 wherein the photosensitive means comprises a photo diode.

15. The apparatus of claim 13 wherein the first and second emitting means comprise infrared emitting diodes, and the electromagnetic energy pulses comprise infrared energy pulses.

16. The apparatus of claim 13 wherein the controller is coupled to the first and second emitting means so as to control the first and second sequences of electromagnetic energy pulses, thereby generating a third sequence of electromagnetic energy pulses.

17. The apparatus of claim 16 wherein the third sequence comprises:
(1) a first pulse for a first interval from the first emitting means;
(2) a second pulse for a third interval from the second emitting means;
(3) a fourth interval during which the first and second emitting means are off; and
(4) repeated cycles comprising (1) through (3).

18. The apparatus of claim 17 wherein the first and third intervals overlap.

19. The apparatus of claim 13 wherein the photosensitive means is mounted on the housing between the first and second emitting means.

20. The apparatus of claim 13 wherein the first structure is a standard watt-hour meter, the housing being adapted for mounting in the standard watt-hour meter.

21. The apparatus of claim 20 wherein the rotatable disk is disposed in a substantially horizontal plane, and the housing is mounted in the standard watt-hour meter below the rotatable disk.

22. An apparatus for recording information about the angular motion of a rotatable disk disposed in a first structure, the disk having at least one aperture through which electromagnetic energy is transmitted, the apparatus comprising:

first means for emitting a first sequence of electromagnetic energy pulses, the first emitting means being mounted on the first structure adjacent a first side of the disk;

second means for emitting a second sequence of electromagnetic energy pulses, the second emitting means being mounted on the first structure adjacent the first side of the disk and separated from the first emitting means in the direction of rotation of the disk;

photosensitive means mounted on the first structure on the opposite side of the disk from the first and second emitting means so that the photosensitive means can receive the electromagnetic energy pulses transmitted through the at least one aperture from both the first and second emitting means at a single point, the photosensitive means being for generating a signal in response to the received electromagnetic energy; and a controller coupled to the photosensitive means for processing the signal to determine the number of rotations of the disk, and the direction of rotation of the disk, the controller also being for synchronizing the first and second sequences of electromagnetic energy pulses such that each electromagnetic energy pulse from the first emitting means is followed by an electromagnetic energy pulse from the second emitting means.

23. The apparatus of claim 22 wherein the photosensitive means comprises a photo diode.

24. The apparatus of claim 22 wherein the first and second emitting means comprise infrared emitting diodes and the electromagnetic energy pulses comprise infrared energy pulses.

25. The apparatus of claim 22 wherein the controller is coupled to the first and second emitting means so as to control the first and second sequences of electromagnetic energy pulses, thereby generating a third sequence of electromagnetic energy pulses.

26. The apparatus of claim 25 wherein the third sequence comprises:
(1) a first pulse for a first interval from the first emitting means;
(2) a second pulse for a third interval from the second emitting means;
(3) a fourth interval during which the first and second emitting means are off; and
(4) repeated cycles comprising (1) through (3).

27. The apparatus of claim 26 wherein the first and third intervals overlap.

28. The apparatus of claim 22 wherein the first structure is a standard watt-hour meter.

29. A method for deriving information about the rotation of a rotatable disk, a first side of the disk having regions with differing reflective properties with respect to electromagnetic energy, the method comprising the steps of:

(1) reflecting a first sequence of electromagnetic energy pulses from a first emitting means from the first side of the disk;

(2) receiving the reflected first sequence of electromagnetic energy pulses from the first emitting means at a first point with a photosensitive means;

(3) generating a first signal pulse with the photosensitive means corresponding to the received first sequence of electromagnetic energy pulses from the first emitting means;

(4) reflecting a second sequence of electromagnetic energy pulses from a second emitting means from the first side of the disk, the second sequence being synchronized with the first sequence such the each electromagnetic energy pulse from the first emitting means is followed by an electromagnetic energy pulse from the second emitting means;

(5) receiving the reflected second sequence of electromagnetic energy pulses from the second emitting means at the first point with the photosensitive means;

(6) generating a second signal pulse with the photosensitive means corresponding to the received second sequence of electromagnetic energy pulses from the second emitting means;

(7) repeating steps (1) through (6), thereby generating a pulse train comprising the first and second signal pulses; and (8) processing the pulse train to determine the number of rotations of the disk, and the direction of rotation of the disk.

30. The method of claim 29 wherein the photosensitive means comprises a photo diode.

31. The method of claim 29 wherein the first and second emitting means comprise infrared emitting diodes and the electromagnetic energy comprises infrared energy.

32. The method of claim 29 wherein the first and second emitting means, and the photosensitive means are mounted on a housing adapted for mounting in a standard watt-hour meter.

33. The method of claim 32 wherein the rotatable disk is disposed in a substantially horizontal plane, and the housing is mounted in the standard watt-hour meter below the rotatable disk.

34. The method of claim 29 wherein the processing step is accomplished by means of a controller, the controller also pulsing the first and second emitting means, thereby causing the first and second emitting means to emit electromagnetic energy in a particular sequence.

35. The method of claim 34 wherein the sequence comprises:
    (1) a first pulse for a first interval from the first emitting means;
    (2) a second pulse for a third interval from the second emitting means;
    (3) a fourth interval during which the first and second emitting means are off; and
    (4) repeated cycles comprising (1) through (3).

36. The method of claim 35 wherein the first and third intervals overlap.

37. A watt-hour meter having a first structure, comprising:
    a rotatable disk disposed within the first structure, the disk having regions with differing properties with respect to electromagnetic energy;
    first means for emitting a first sequence of electromagnetic energy pulses in a first direction toward the disk, the first emitting means being mounted on the first structure adjacent a first side of the disk;
    second means for emitting a second sequence of electromagnetic energy pulses in a second direction toward the disk, the second emitting means being mounted on the first structure adjacent the first side of the disk, the first and second directions being such that the first and second sequences of electromagnetic energy pulses reflect from the first side of the disk in different areas, the areas being separated in the direction of rotation of the disk;
    photosensitive means mounted on the first structure so that the photosensitive means can receive the electromagnetic energy pulses from both the first and second emitting means at a single point, the photosensitive means being for generating a signal in response to the received electromagnetic energy pulses; and
    a controller coupled to the photosensitive means for processing the signal to determine the number of rotations of the disk, and the direction of rotation of the disk, the controller also being for synchronizing the first and second sequences of electromagnetic energy pulses such that each electromagnetic energy pulse from the first emitting means is followed by an electromagnetic energy pulse from the second emitting means.

* * * * *

UNITED STATES PATENT AND TRADEMARK OFFICE
CERTIFICATE OF CORRECTION

PATENT NO. : 5,442,281
DATED : August 15, 1995
INVENTOR(S) : MYRON I. FRISCH, AHMED NAUMAAN It is certified that error appears in the above-indentified patent and that said Letters Patent is hereby corrected as shown below:

Col. 1, line 9, delete "aid", insert --and--

Col. 2, line 38, delete "memos", insert --means--

Col. 2, line 49, delete "theft", insert --then--

Col. 6, line 19, after "symbol", delete ":"

Col. 9, line 30, delete "Sequences", insert --sequences--

In Appendix A Hexadecimal Line No.'s 0203, delete ".", insert --,--

020E, delete ".", insert --,--

021E, delete ".", insert --,--

0230, delete ".", insert --,--

0236, delete ".", insert --,--

0239, delete ".", insert --,--

023B, delete ".", insert --,--

UNITED STATES PATENT AND TRADEMARK OFFICE
CERTIFICATE OF CORRECTION

PATENT NO. : 5,442,281

DATED : August 15, 1995

INVENTOR(S) : MYRON I. FRISCH, AHMED NAUMAAN

It is certified that error appears in the above-indentified patent and that said Letters Patent is hereby corrected as shown below:

023D, delete ".", insert --,--

0240, delete ".", insert --,--

0241, delete ".", insert --,--

0243, delete ".", insert --,--

0250, delete ".", insert --,--

0255, delete ".", insert --,--

0255 9802, delete ".", insert --,--

0258, delete ".", insert --,--

025B 9801, delete ".", insert --,--

025E, delete ".", insert --,--

0261, delete ".", insert --,--

0261 9800, delete ".", insert --,--

0263, delete ".", insert --,--

0264, delete ".", insert --,--

0269, delete ".", insert --,--

UNITED STATES PATENT AND TRADEMARK OFFICE
CERTIFICATE OF CORRECTION

PATENT NO. : 5,442,281
DATED : August 15, 1995
INVENTOR(S) : MYRON I. FRISCH, AHMED NAUMAAN It is certified that error appears in the above-indentified patent and that said Letters Patent is hereby corrected as shown below:

0269 9802, delete ".", insert --,--

026B, delete ".", insert --,--

026C, delete ".", insert --,--

0271, delete ".", insert --,--

0271 9801, delete ".", insert --,--

0273, delete ".", insert --,--

0274, delete ".", insert --,--

0281, delete ".", insert --,--

0289, delete ".", insert --,--

0294, delete ".", insert --,--

Signed and Sealed this

Second Day of April, 1996

Attest:

BRUCE LEHMAN

*Attesting Officer*    *Commissioner of Patents and Trademarks*